United States Patent
Matsuura

(10) Patent No.: US 7,295,286 B2
(45) Date of Patent: Nov. 13, 2007

(54) EXPOSURE DEVICE AND METHOD OF EXPOSURE

(75) Inventor: Seiji Matsuura, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 11/439,113

(22) Filed: May 24, 2006

(65) Prior Publication Data

US 2007/0002302 A1   Jan. 4, 2007

(30) Foreign Application Priority Data

May 26, 2005   (JP) .............................. 2005-154215

(51) Int. Cl.
G03B 27/72   (2006.01)
G03B 27/54   (2006.01)

(52) U.S. Cl. .......................................... 355/71; 355/67

(58) Field of Classification Search .................. 355/53, 355/55, 67–71; 250/548; 430/311; 359/484–487
See application file for complete search history.

(56) References Cited

U.S. PATENT DOCUMENTS 5,815,247 A * 9/1998 Poschenrieder et al. ...... 355/71
6,839,125 B2 * 1/2005 Hansen ......................... 355/67
6,970,233 B2 * 11/2005 Blatchford .................... 355/71

FOREIGN PATENT DOCUMENTS

| JP | 5-109601 | 4/1993 |
| JP | 7-183201 | 7/1995 |
| JP | 7-201723 | 8/1995 |

* cited by examiner

*Primary Examiner*—Henry Hung Nguyen
(74) *Attorney, Agent, or Firm*—Young & Thompson

(57) ABSTRACT

The exposure device includes a polarizing plate and an illumination diaphragm. The polarizing plate is located in an optical path between a light source and a photomask, serving as a polarizing unit that polarizes an illuminating light from the light source in the first and the second direction orthogonal to the optical axis. The illumination diaphragm is a so-called quadruple illumination diaphragm, which includes four openings. The first opening and the second opening are located on a straight line running parallel to a third direction perpendicular to the optical axis and passing the center point of the illumination diaphragm, across the center point from each other. Likewise, the third opening and the fourth opening are located on a straight line running parallel to a fourth direction perpendicular to the optical axis and passing the center point, across the center point from each other.

6 Claims, 11 Drawing Sheets

EXPOSURE DEVICE AND METHOD OF EXPOSURE

This application is based on Japanese patent application No. 2005-154215, the content of which is incorporated hereinto by reference.

BACKGROUND

1. Technical Field

The present invention relates to an exposure device and a method of exposure.

2. Related Art

For transferring by exposure a fine pattern such as a semiconductor IC pattern to a photosensitive substrate (such as a wafer) on which a resist is applied, it is a common procedure to interpose a projection optical system between a photomask and the wafer, so as to project the image of the mask pattern on the wafer surface.

The ongoing micronization of the design rule has motivated further development of methods for actively controlling a polarization status of the illuminating light or a shape of the opening of the illumination diaphragm. It is known today, for example as disclosed in Japanese Laid-open patent publication No. H05-109601, that resolution with respect to a repeating one-dimensional pattern such as a line-and-space pattern can be effectively upgraded by a combination of (1) a deformed illumination diaphragm that shields a portion of the illuminating light close to the optical axis, thus to transmit only a portion of the illuminating light distant from the optical axis, and (2) a so-called linear polarization of controlling the polarization direction (electric field vector) so as to be parallel to the longitudinal direction of the repeating pattern.

In addition, for improving the resolution with respect to a repeating one-dimensional pattern drawn in two directions, namely transversely and vertically, not only the pattern in one specific direction, for example Japanese Laid-open patent publication No. H07-201723 proposes a combination of (1) a quadruple diaphragm that only transmits the illuminating light in two directions distant from the optical axis, and (2) linear polarization in two directions. The polarization can be caused by various methods, out of which a typical method is placing a polarizing plate immediately anterior to the illumination diaphragm, and disposing a wavelength plate where appropriate, thus to change the polarization direction.

SUMMARY OF THE INVENTION

Meanwhile, a semiconductor IC pattern includes not only the simply repeating one-dimensional pattern drawn in two directions, but also an end of a one-dimensional pattern (line end), a turning point thereof (at which the pattern winds), and a layer provided with a hole pattern connecting the one-dimensional patterns formed in layers different from each other. All of these patterns have two-dimensional characteristics. It is known that the resolution of a dense hole pattern densely arranged in two directions, for instance the directions of 0 and 90 degrees, is the most liable to be short. Although the combination of the deformed illumination diaphragm and the linear polarization effectively works with the repeating one-dimensional pattern, the combination is not effective with respect to a repeating two-dimensional pattern such as a dense hole pattern. The reason is as follows.

Necessary conditions for improving the resolution are that an illuminating light should be incident on the photomask along the direction which is not included in the plane including the pattern on the photomask and the optical axis, and the illuminating light (diffracted light) diffracted by the pattern should be incident on a pupil plane of the projection optical system without suffering an eclipse. When projecting a fine pattern the diffraction angle is increased, which often results in emergence of the eclipse at the pupil plane. This can be prevented by inclining the illuminating light in advance. Such method can be carried out by employing the deformed illumination diaphragm.

For further satisfying a sufficient condition that the diffracted lights should interfere with each other at the wafer surface, however, it is desirable that the diffracted lights are polarized in parallel to each other. The necessary and sufficient conditions herein referred to can be paraphrased as (i) the alignment direction of the openings of the illumination diaphragm should be orthogonal to the longitudinal direction of the pattern, and (ii) the polarization direction should be orthogonal to the alignment direction of the corresponding openings of the illumination diaphragm.

Regarding the repeating one-dimensional pattern, it is easy to satisfy the foregoing conditions (i) and (ii). This aspect will be clarified referring to FIGS. 8A to 8D. In FIGS. 8A to 8D, the optical axis is set in Z-direction, and the longitudinal direction of the repeating one-dimensional pattern is set in Y-direction. As shown in FIG. 8A, openings 122 of an illumination diaphragm 121 are aligned in X-direction (horizontal direction in FIG. 8A). In FIG. 8B, which shows a polarizing plate 123, a polarized component close to the illumination diaphragm is set in the Y-direction (vertical direction in FIG. 8B). Also, arrows 124 indicate the direction (polarization direction) of the electric field vector of the illuminating light controlled by the polarizing plate 123.

In this case, the polarized component of the diffracted lights is equally oriented in the Y-direction (direction perpendicular to the paper surface of FIG. 8C) on the wafer surface, as shown in FIG. 8C. FIG. 8C shows a 0-th order diffracted light 125 on the wafer surface, and a first order diffracted light 126 in the X-direction on the wafer surface. The polarization direction of the diffracted lights 125, 126 is designated by marks 127, 128 respectively. Such setting allows the diffracted lights to efficiently interfere with each other, thereby improving the contrast of the optical image thus facilitating the pattern formation.

On the other hand, when the alignment direction of the openings 122 of the illumination diaphragm 121 is shifted to the Y-direction from the X-direction, the diffracted light suffers an eclipse at the pupil plane, and hence a clear optical image cannot be obtained since the diffracted lights are kept from interfering with each other. Also, when the polarized component close to the illumination diaphragm is set in the X-direction instead of the Y-direction, the polarized component of the diffracted light on the wafer surface is oriented in a direction close to ±Z-direction (close to ±90 degrees to the wafer surface), as shown in FIG. 8D. Accordingly, the diffracted lights cancel out each other, thus leading to failure in forming a clear optical image. Here, as already stated an appropriate combination of the polarizing plate and the wavelength plate allows improving the resolution with respect to the repeating one-dimensional pattern having a plurality of directions.

Unlike the above, regarding the repeating two-dimensional pattern represented by the hole pattern, it is fundamentally impossible to satisfy the above-mentioned conditions (i) and (ii). The reason will be described referring to FIGS. 9A to 9D. When the optical axis is set in the Z-direction and the repeating two-dimensional pattern (vertically and horizontally symmetric) is aligned in the X- and Y-direction, the diffracted light in both of the X- and Y-direction have to be incident upon the pupil plane. To achieve this, openings 132 of an illumination diaphragm 131 have to be disposed in a direction of ±45 degrees, as shown in FIG. 9A. In other words, the illumination diaphragm 131 is a quadruple illumination diaphragm. In FIG. 9A, a horizontal direction corresponds to the X-direction, and a vertical direction to the Y-direction.

When the openings 132 of the illumination diaphragm 131 are aligned in the X- or Y-direction, the diffracted light in the Y- or X-direction suffers the eclipse at the pupil plane, so that the diffracted lights do not interfere with each other, and hence the desired pattern cannot be obtained. In addition, it is impossible to optimize the polarized component close to the illumination diaphragm 131 in both of the X- and Y-direction. The reason is as follows. Assuming that the polarized component is oriented in the X-direction, the polarized component of the Y-direction diffracted light on the wafer surface intersects at an angle close to 60 degrees as shown in FIG. 9B, which allows the diffracted lights to interfere with each other to a certain extent. On the other hand, the polarized component of the X-direction diffracted light on the wafer surface is oriented close to the ±Z-direction, so that the diffracted lights cancel out each other, thus leading to failure in forming a clear optical image, as far as the X-direction is concerned. FIG. 9B shows a 0-th order diffracted light 133 on the wafer surface, a first order X-direction diffracted light 134 on the wafer surface, and a first order Y-direction diffracted light 135 on the wafer surface. Also, the polarization direction of the diffracted lights 133, 134, 135 is respectively indicated by arrows 136, 137, 138.

Likewise, when the polarized component is oriented in the Y-direction, the polarized component of the X-direction diffracted light on the wafer surface intersects at an angle close to 60 degrees as shown in FIG. 9C, which allows the diffracted lights to interfere with each other to a certain extent, while the polarized component of the Y-direction diffracted light on the wafer surface is oriented close to the ±Z-direction, so that the diffracted lights cancel out each other. Therefore, a clear optical image cannot be obtained, as far as the Y-direction is concerned. Further, when the polarized component is oriented in a direction of ±45 degrees, the polarized components of the X- and Y-direction diffracted lights on the wafer surface both intersect at an angle close to 90 degrees as shown in FIG. 9D, so that the diffracted lights are kept from effectively interfering with each other, which leads to failure in forming a clear optical image in either of the X- or Y-direction.

The foregoing description refers to the cases where the polarized component is oriented in the X-direction, the Y-direction, and in ±45 degrees, from which it is now evident that it is fundamentally difficult to improve the resolution by a monodirectional polarization control, as far as the repeating two-dimensional pattern. Thus the existing exposure devices and exposure methods still have a room for improvement, in the aspect of the resolution.

According to the present invention, there is provided an exposure device comprising a polarizing unit provided in an optical path between a light source and a photomask, so as to polarize an illuminating light from the light source in a first and a second direction perpendicular to an optical axis of the illuminating light; and an illumination diaphragm provided in an optical path between the polarizing unit and the photomask; wherein the illumination diaphragm includes a first and a second opening located on a straight line running parallel to a third direction perpendicular to the optical axis and passing a center point of the illumination diaphragm, across the center point from each other, and a third and a fourth opening located on a straight line running parallel to a fourth direction perpendicular to the optical axis and passing the center point, across the center point from each other; and the illuminating light polarized in the first and the second direction by the polarizing unit passes through each of the openings.

The center point of the illumination diaphragm is herein defined as the intersection point of the illumination diaphragm and the optical axis of the illuminating light, irrespective of the shape of the illumination diaphragm.

In the exposure device thus constructed, the illuminating light polarized in the first and the second direction passes through the each opening provided in the illumination diaphragm. Such configuration enables inhibiting a part or the whole of a component polarized in the first direction, of the first order diffracted light diffracted in the first direction by the photomask, from being incident upon a pupil plane of a projection optical system. Likewise, such exposure device can inhibit a part or the whole of a component polarized in the second direction, of the first order diffracted light diffracted in the second direction by the photomask, from being incident upon the pupil plane of the projection optical system. The component polarized in the first direction of the first order diffracted light, diffracted in the first direction, as well as the component polarized in the second direction of the first order diffracted light, diffracted in the second direction, incur degradation of an optical image to be formed on an object of the exposure, such as a wafer. Therefore, inhibiting a part or the whole of such polarized component from being incident upon the pupil plane leads to improvement in resolution of the exposure device.

According to the present invention, an exposure device and a method of exposure that assures excellent resolution, also with respect to a two-dimensional pattern represented by the dense hole pattern densely arranged in two directions.

BRIEF DESCRIPTION OF THE DRAWINGS

The above and other objects, advantages and features of the present invention will be more apparent from the following description taken in conjunction with the accompanying drawings, in which.

DETAILED DESCRIPTION

Figure 1:
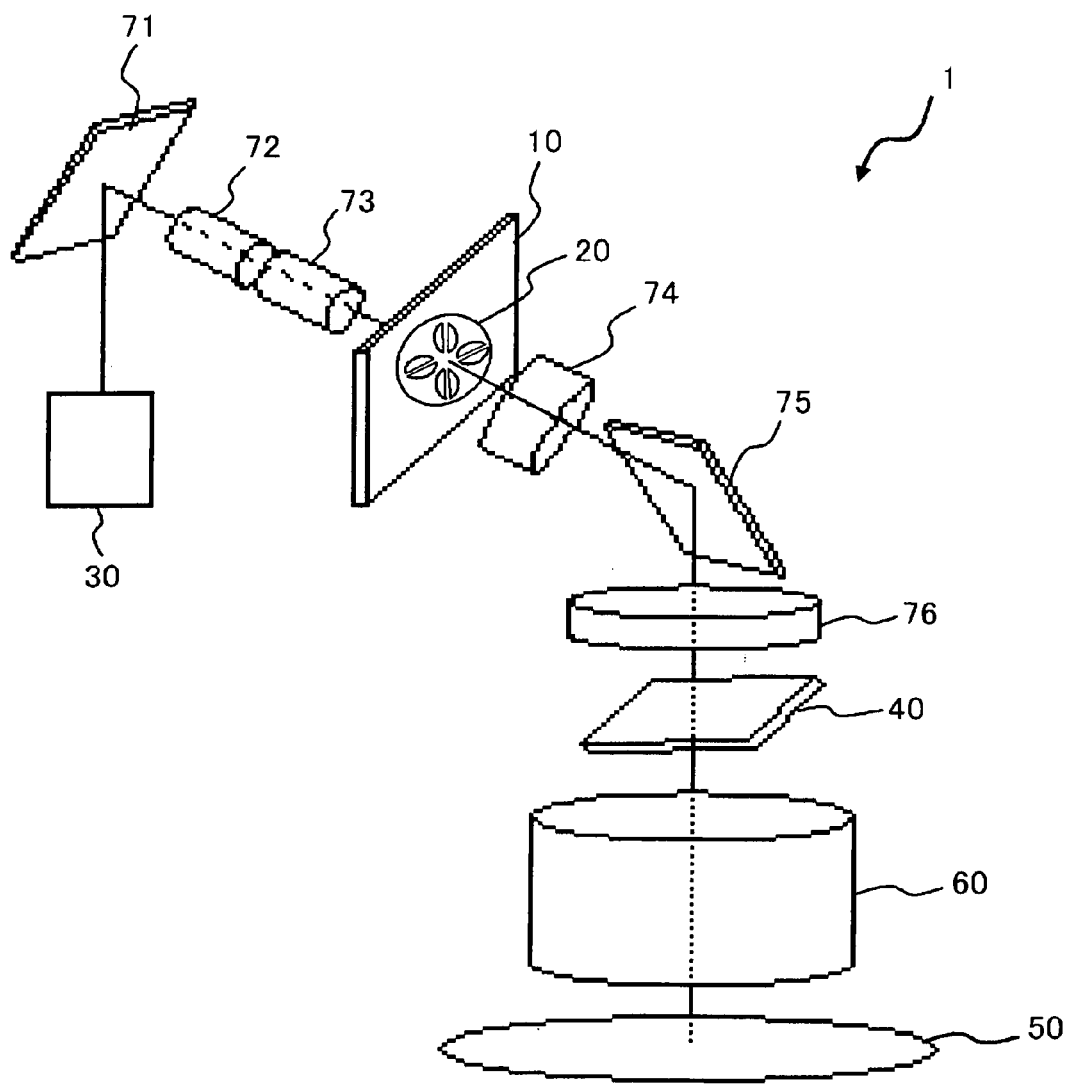
FIG. 1 is a perspective view showing an exposure device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Hereunder, an embodiment of an exposure device and a method of exposure according to the present invention will be described in details, referring to the accompanying drawings. In the drawings, same constituents are given the identical numerals, and duplicating description may be omitted where appropriate.

FIG. 1 is a perspective view showing the exposure device according to the embodiment of the present invention. The exposure device 1 includes a polarizing plate 10, and an illumination diaphragm 20. The exposure device 1 applies an illuminating light from a light source 30 to a wafer 50 (object of the exposure).

The polarizing plate 10 is located in an optical path between the light source 30 and a photomask 40, serving as a polarizing unit that polarizes the illuminating light from the light source 30 in the first and the second direction orthogonal to the optical axis. Hereinafter, the first and the second direction will be referred to as X- and Y-direction respectively.

Figure 2A:
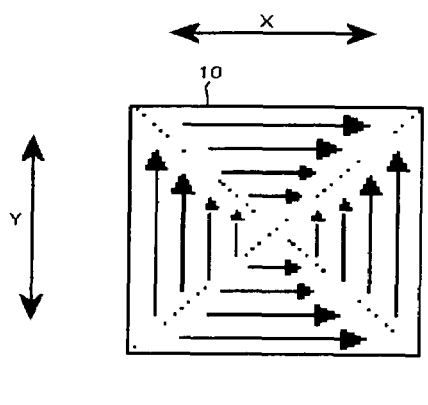
FIGS. 2A and 2B are front views showing a polarizing plate and an illumination diaphragm respectively, provided in the exposure device of FIG. 1.

FIG. 2A is a front view showing the polarizing plate 10. The arrows in FIG. 2A indicate electric field vectors of the illuminating light polarized by the polarizing plate 10. The polarization direction is set in the X-direction in regions delimited as $45°<\phi<135°$ and $225°<\phi<315°$ ($=-45°$), and in the Y-direction in regions delimited as $135°<\phi<225°$ ($=-135°$) and $315°$ ($=-45°$)$<\phi<45°$, where $\phi$ represents an angle with respect to a positive side of the X-direction (toward the right in FIG. 2A).

Figure 3:
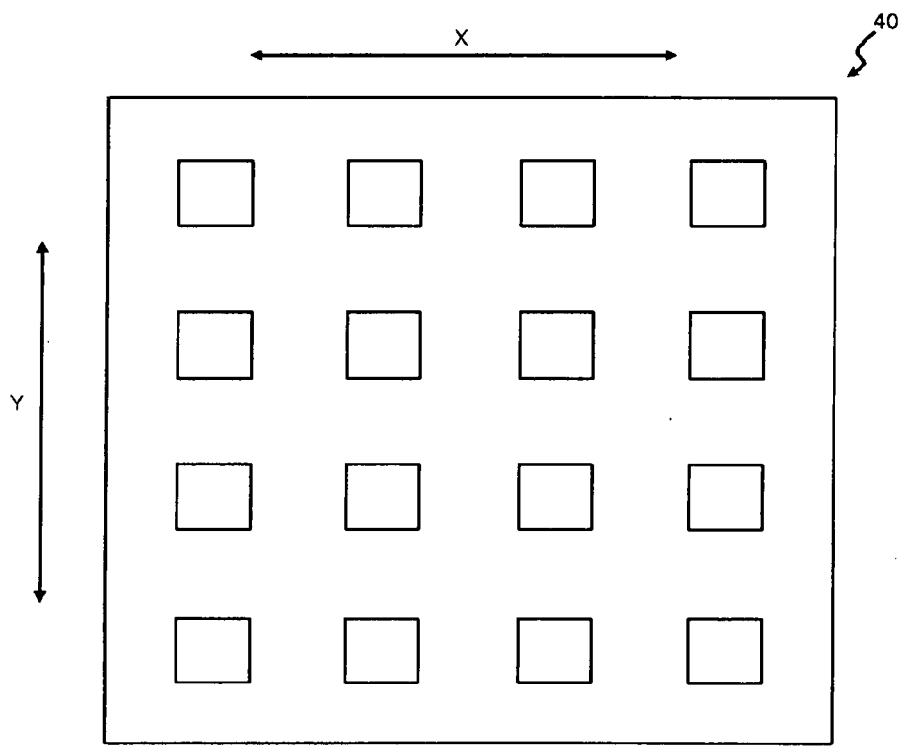
FIG. 3 is a plan view showing a pattern of a photomask.

In this embodiment, the pattern on the photomask 40 is a repeating two-dimensional pattern as shown in FIG. 3, and is aligned in the X-direction and the Y-direction. In FIG. 3, rectangular-shaped holes are aligned in a grid pattern. Here, the polarizing plate 10 may include a wavelength plate, where appropriate.

Figure 2B:
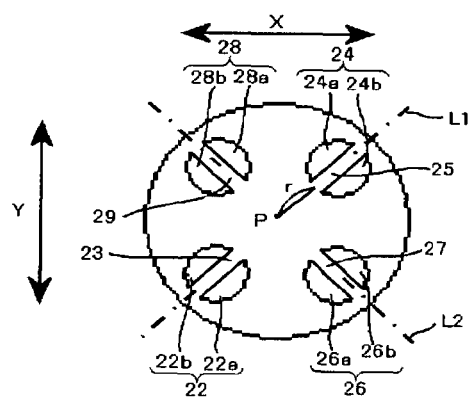

In the optical path between the polarizing plate 10 and the photomask 40, the illumination diaphragm 20 is provided. As shown in FIG. 2B, the illumination diaphragm 20 is a so-called quadruple illumination diaphragm, which includes four openings 22, 24, 26, 28. The opening 22 (first opening) and the opening 24 (second opening) are located on a straight line (dash-dot line L1 in FIG. 2B) running parallel to a third direction perpendicular to the optical axis and passing the center point P of the illumination diaphragm 20, across the center point P from each other. Likewise, the opening 26 (third opening) and the opening 28 (fourth opening) are located on a straight line (dash-dot line L2 in FIG. 2B) running parallel to a fourth direction perpendicular to the optical axis and passing the center point P, across the center point P from each other. Here, the center point P is defined as the intersection point of the illumination diaphragm 20 and the optical axis of the illuminating light, irrespective of the shape of the illumination diaphragm 20.

The exposure device 1 is configured so that the illuminating light polarized in the X- and Y-direction by the polarizing plate 10 passes through the each of the openings 22, 24, 26, 28.

The third direction is parallel to neither the X- nor the Y-direction. Likewise, the fourth direction is parallel to neither the X- nor the Y-direction. Specifically, these directions are oriented so that a condition of $0<\theta_3<\theta_2<\theta_4<180°$ is satisfied, where $\theta_2$, $\theta_3$ and $\theta_4$ represent an angle at which a straight line parallel to the second direction (Y-direction), the third direction and the fourth direction, respectively, crosses with a straight line parallel to the first direction (X-direction). Here, such angles are to be taken counter-clockwise. In this embodiment in particular, $\theta_2$, $\theta_3$ and $\theta_4$ are set substantially as 90°, 45° and 135° respectively.

The illumination diaphragm 20 further includes shielding portions 23, 25, 27, 29 respectively provided in the openings 22, 24, 26, 28. The shielding portions 23, 25, 27, 29 divide the corresponding openings 22, 24, 26, 28 into two sections. To be more detailed, the opening 22 is divided by the shielding portion 23 into sub-openings 22a, 22b. The opening 24 is divided by the shielding portion 25 into sub-openings 24a, 24b. The opening 26 is divided by the shielding portion 27 into sub-openings 26a, 26b. Equally, the opening 28 is divided by the shielding portion 29 into sub-openings 28a, 28b.

The shielding portions 23, 25, 27, 29 are of a strip shape. The shielding portions 23, 25 extend along the third direction, and the shielding portions 27, 29 extend along the fourth direction. The width w of these shielding portions 23, 25, 27, 29 is set so as to satisfy $0<w\leq0.2$. Here, the distance r from the center point P to each opening 22, 24, 26, 28 (Ref. FIG. 2B), namely the coherency is regarded as 1. Although the distance from the center point P to each opening 22, 24, 26, 28 may be different from one another, in this embodiment the distance is assumed to be equal to one another.

Figure 2C:
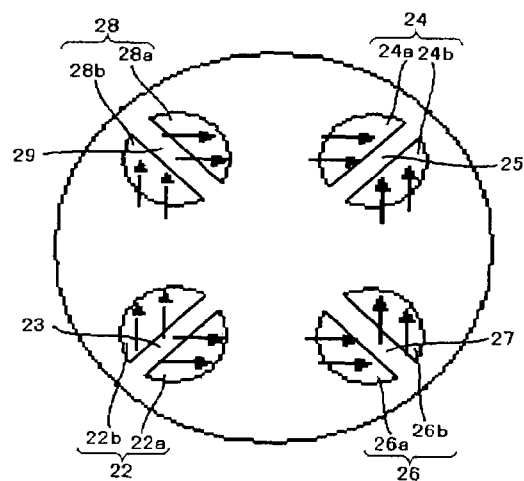
FIG. 2C is a front view of the illumination diaphragm for explaining relations between openings of the illumination diaphragm and a polarization direction of an illuminating light.

Referring to FIG. 2C, in the exposure device 1 the illuminating light polarized in the X-direction passes through the sub-openings 22a, 24a, 26a, 28a (first sub-openings), and the illuminating light polarized in the Y-direction passes through the sub-openings 22b, 24b, 26b, 28b (second sub-openings). In other words, from the viewpoint of the openings 22, 24, 26, 28 of the illumination diaphragm 20, although the polarized components in both X- and Y-direction are passing therethrough, the polarized lights are blocked by the illumination diaphragm 20 at an interface between the polarized lights.

The exposure device 1 also includes a mirror 71, a collecting lens 72 and an optical integrator 73 sequentially disposed from the side of the light source in the optical path between the light source 30 and the polarizing plate 10. Further, in the optical path between the illumination diaphragm 20 and the photomask 40, a condenser lens 74, a mirror 75 and a condenser lens 76 are sequentially disposed from the side of the illumination diaphragm 20. Between the photomask 40 and the wafer 50, a projection optical system 60 is provided, for forming an image of the pattern on the photomask 40 and projecting that image on the wafer 50.

The following passages cover an embodiment of a method of exposure according to the present invention, as well as an operation of the exposure device 1. The illuminating light emitted by the light source 30 is reflected by the mirror 71, and passes through the collecting lens 72 and the optical integrator 73 thus to be incident upon the polarizing plate 10. Then the illuminating light, now polarized in the X- and Y-direction is emitted by the polarizing plate 10. Such polarized illuminating light is incident upon the illumination diaphragm 20.

The illuminating light passes, upon passing through each of the openings 22, 24, 26, 28 of the illumination diaphragm 20, through the condenser lens 74 to be incident upon the mirror 75, and is thereby reflected and incident upon the photomask 40 through the condenser lens 76. Upon reaching the photomask 40, the illuminating light is thereby diffracted. Such diffracted illuminating light passes through the projection optical system 60 thus to be incident upon the wafer 50. At this stage, the image of the pattern on the photomask 40 is formed on the wafer 50.

In a word, the method of exposure according to this embodiment employs the exposure device 1, so as to make the illuminating light polarized in the X- and Y-direction by the polarizing plate 10 pass through each of the openings 22, 24, 26, 28 of the illumination diaphragm 20, and thereafter be incident on the photomask 40.

The foregoing embodiment offers the following advantageous effects. According to this embodiment, the illuminating light polarized in the two directions namely the X- and Y-direction enters each of the openings 22, 24, 26, 28 provided in the illumination diaphragm 20. Such arrangement allows inhibiting a part or the whole of the component polarized in the X-direction of the first order diffracted light, diffracted by the photomask 40 in the X-direction, from being incident upon the pupil plane of the projection optical system 60. Likewise, this embodiment allows inhibiting a part or the whole of the component polarized in the Y-direction of the first order diffracted light, diffracted by the photomask 40 in the Y-direction, from being incident upon the pupil plane of the projection optical system 60.

The component polarized in the X-direction of the first order diffracted light, diffracted in the X-direction, as well as the component polarized in the Y-direction of the first order diffracted light, diffracted in the Y-direction incur degradation of an optical image to be formed on the wafer 50, as will be subsequently described. Therefore, inhibiting a part or the whole of such polarized components from being incident upon the pupil plane leads to improvement in resolution of the exposure device 1. Consequently, this embodiment provides an exposure device and a method of exposure that assures excellent resolution, also with respect to a two-dimensional pattern.

The polarization direction (X- and Y-direction) of the polarizing plate 10 is the same as the alignment direction of the pattern on the photomask 40. Accordingly, the X-direction diffracted light can contain the Y-direction polarized component, and the Y-direction diffracted light can contain the X-direction polarized component. This allows the diffracted lights of both the X- and Y-direction to efficiently interfere with each other.

The foregoing angles $\theta_2$, $\theta_3$ and $\theta_4$ are set so as to satisfy the condition of $0<\theta_3<\theta_2<\theta_4<180°$. Such setting allows the diffracted lights of both the X- and Y-direction to be incident upon the pupil plane of the projection optical system 60.

The angles $\theta_2$, $\theta_3$ and $\theta_4$ are set substantially at 90°, 45° and 135° respectively. Such setting allows achieving excellent resolution particularly with respect to a two-dimensional pattern aligned in two directions orthogonal to each other.

The openings 22, 24, 26, 28 are configured so that the illuminating light polarized in the X- and Y-direction passes through the first and the second sub-openings. Such configuration allows inhibiting a portion of the light, corresponding to the interface between the components polarized in the X- and Y-direction, from serving as a secondary light source. As will be described later, this significantly contributes to formation of a clear optical image on the wafer 50.

The shielding portions 23, 25 are disposed so as to extend along the third direction, and the shielding portions 27, 29 along the fourth direction. Such configuration allows effectively shielding a portion corresponding to the interface between the components polarized in the X- and Y-direction.

The width w of the shielding portions 23, 25, 27, 29 is set so as to satisfy the condition of $0<w\leq0.2$ with respect to the coherency. It is desirable to set the width w to be infinitely small, which, though, is practically unachievable. From the practical viewpoint it is preferable to set the width w in the foregoing range, because an excessive width incurs reduction in wafer processing speed due to degradation in resolution and reduction in light transmission with respect to a pattern of specific dimensions.

Figure 4:
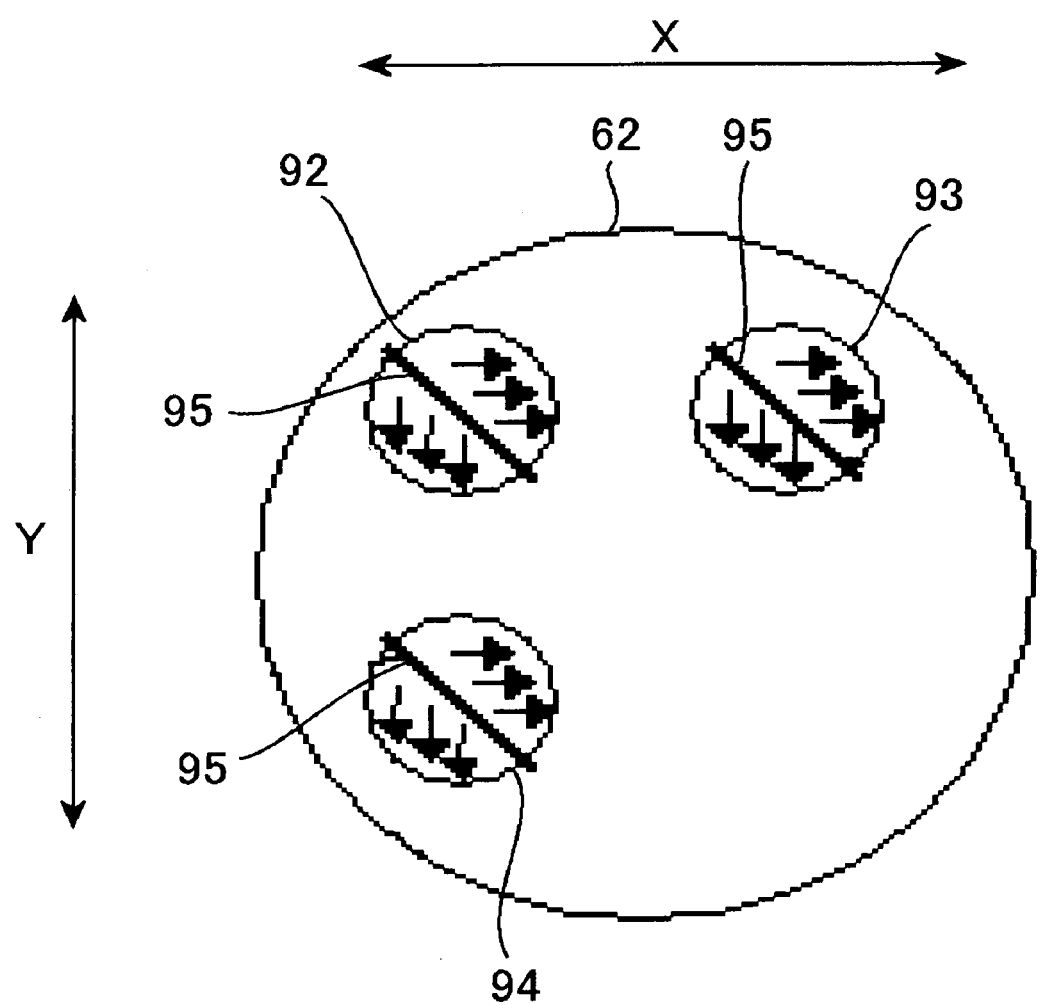
FIG. 4 is a front view of the illumination diaphragm for explaining the advantage of the embodiment.
Figure 5:
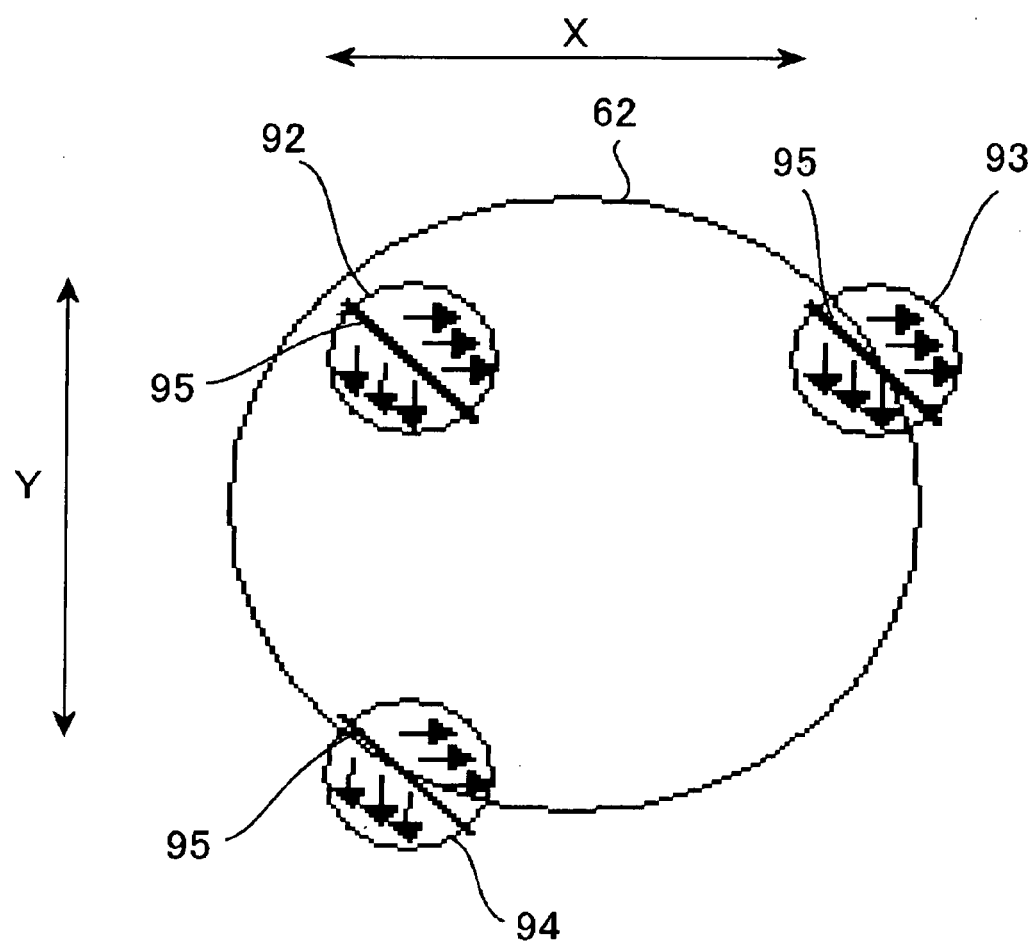
FIG. 5 is a front view of the illumination diaphragm for explaining the advantage of the embodiment.

Referring now to FIGS. 4 and 5, the benefits provided by this embodiment will be described in further details. FIGS. 4 and 5 illustrate a distribution of the diffracted light on the pupil plane 62 of the projection optical system 60, obtained when a pattern of holes aligned vertically and horizontally at a ratio of 1:1 is exposed by quadruple illumination under a bidirectional polarization control in the X- and Y-direction. The drawings include a 0-th order diffracted light 92, an X-direction first order diffracted light 93, a Y-direction first order diffracted light 94, and a region 95 corresponding to the shielding portions where the diffracted light is not incident. Arrows in the drawings indicate the polarization direction of the diffracted light. It is to be noted that, for the sake of explicitness, the following description refers to only one of the openings of the illumination diaphragm 20.

FIG. 4 represents a case where the mask pattern is of a medium size, in which both of the X-direction and the Y-direction first order diffracted lights 93, 94 are fully incident upon the pupil plane 62. Therefore, as stated earlier, there is no polarized component capable of optimizing the interference between the diffracted lights, in both of the X-direction and the Y-direction.

In contrast, FIG. 5 represents a case where the mask pattern is of a fine size, in which approx. 50% of the X-direction and the Y-direction first order diffracted lights 93, 94 are incident upon the pupil plane 62. Here, what is significant is that, under the bidirectional polarization control in the X- and Y-direction, only the Y-polarized component in the X-direction first order diffracted light 93, and only the X-polarized component in the Y-direction first order diffracted light 94 can pass through the pupil plane 62. These components intersect each other at an angle close to 60 degrees on the surface of the wafer 50, though not completely parallel, thereby contributing to a certain extent to the formation of a clear optical image.

On the other hand, the X-polarized component in the X-direction diffracted light 93 and the Y-polarized component in the Y-direction diffracted light 94 would intersect each other in a direction close to the Z-direction on the wafer 50 (close to ±90 degrees to the wafer surface), thereby degrading the optical image rather than improving. According to this embodiment, however, a part or the whole of such components can be blocked at the pupil plane 62, which effectively prevents the degradation of the optical image.

The pitch d (alignment pitch of the pattern on the photomask 40) that allows 50% each of the X- and Y-direction first order diffracted light 93, 94 shown in FIG. 5 to be incident upon the pupil plane 62 can be obtained by the following equation (1). When the pitch is finer than the definition by this equation, this embodiment provides an evidently superior effect to that achieved by the conventional technique.

$$d/2=\lambda/\{2^{1/2} \times NA \times (1+\sigma)\} \qquad (1)$$

where $\lambda$ represents the wavelength of the illuminating light, NA the numerical aperture of the projection optical system 60, and σ the coherency. Here, the σ stands for a ratio to the NA in this equation. Accordingly, this embodiment provides a particularly prominent effect when the following equation is satisfied:

$$d/2 \leq \lambda/\{2^{1/2} \times NA \times (1+\sigma)\} \qquad (2)$$

Meanwhile, regarding the bidirectional polarization control, two options appear to be feasible in processing the interface between the X- and Y-polarized components. One is discontinuously joining the interface as it is, and the other is continuously varying the polarization method (rounding) only at the interface. From the viewpoint of improvement of the resolution, however, neither method provides a favorable effect.

In the both methods, a linear polarization in ±45 degrees can be achieved when locally viewed in the directions of ±45 degrees (third and fourth direction in this embodiment). However as already stated, the polarized components of the X-direction and the Y-direction diffracted lights intersect at an angle close to 90 degrees on the wafer surface, and hence do not effectively interfere with each other thus leading to failure in forming a clear optical image in both of the X- and Y-direction. Therefore, it is preferable not to employ the portion corresponding to the interface between the polarized components as a secondary light source. That is why the portion of the illumination diaphragm 20 corresponding to the interface between the polarized components of different directions is blocked in a strip shape, in this embodiment.

WORKING EXAMPLE 1

A simulation was performed with an F2 excimer laser of a wavelength of 157 nm employed as the illuminating light, under the condition of NA=0.95, coherency σ=0.7, and $\sigma_{rad}$=0.2 (ratio of the diameter of each opening to the NA). The mask pattern employed for this simulation was the two-dimensional pattern of holes regularly aligned vertically and horizontally at a ratio of 1:1 as shown in FIG. 3. The length of a side of the hole was set as 60 nm, and the alignment pitch d was set as 120 nm.

The simulation was performed with respect to the following cases.

Figure 11A:
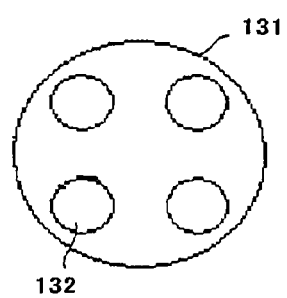
Figure 11B:
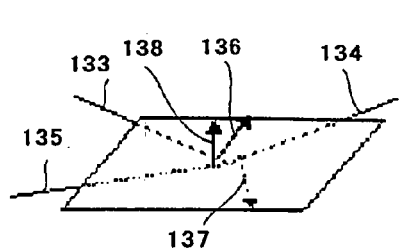
Figure 11C:
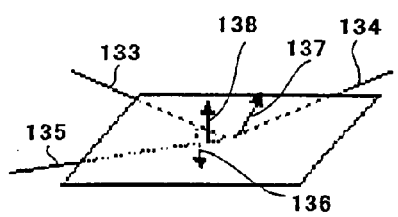
Figure 11D:
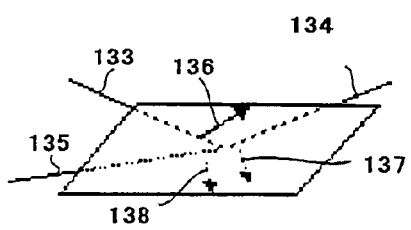

(1) With a quadruple illumination diaphragm shown in FIG. 11A, but without performing the polarization control (comparative example)

(2) With the illumination diaphragm 20 (width w set as 0.1 with respect to the coherency) shown in FIG. 2B, under the bidirectional polarization control in the X- and Y-direction (working example)

Figure 6:
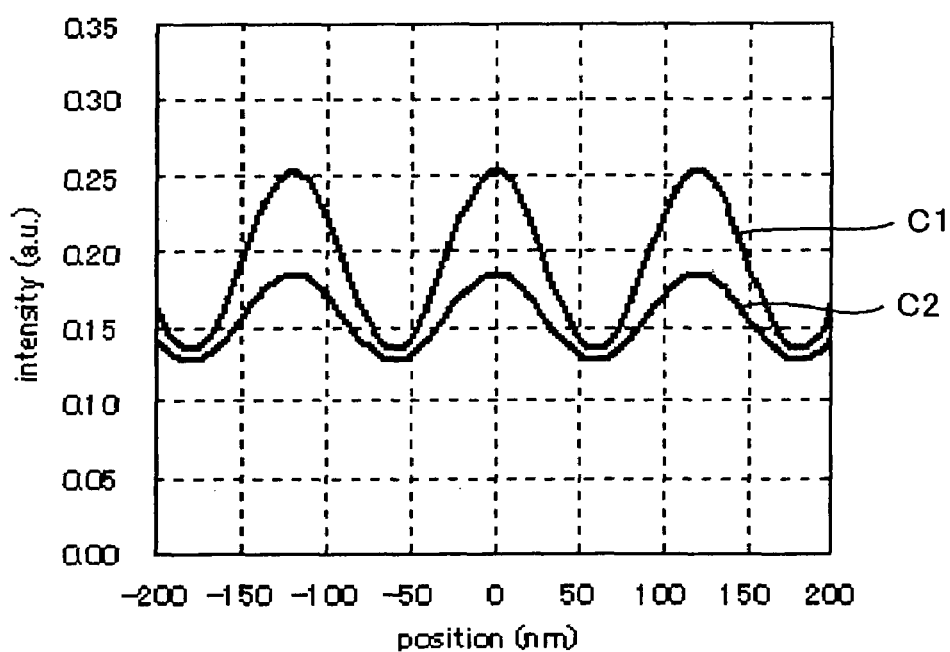
FIG. 6 is a line graph for comparison of the spatial image calculation results between the working example and the comparative example.

FIG. 6 shows a cross-sectional light intensity distribution in a central portion of the hole pattern. In FIG. 8, curves C1 and C2 respectively corresponds to the working example and the comparative example. In such simulation, an index called NILS (Normalized Image Log-Slope) is popularly employed. The greater the NILS is, the smaller fluctuation in size is achieved with respect to an error in exposure amount, thereby allowing formation of the better stabilized pattern. As is apparent from FIG. 6, the NILS in the comparative example was 0.57 while the NILS in the working example was 0.97, which corresponds to an improvement of approx. 67%.

Figure 7:
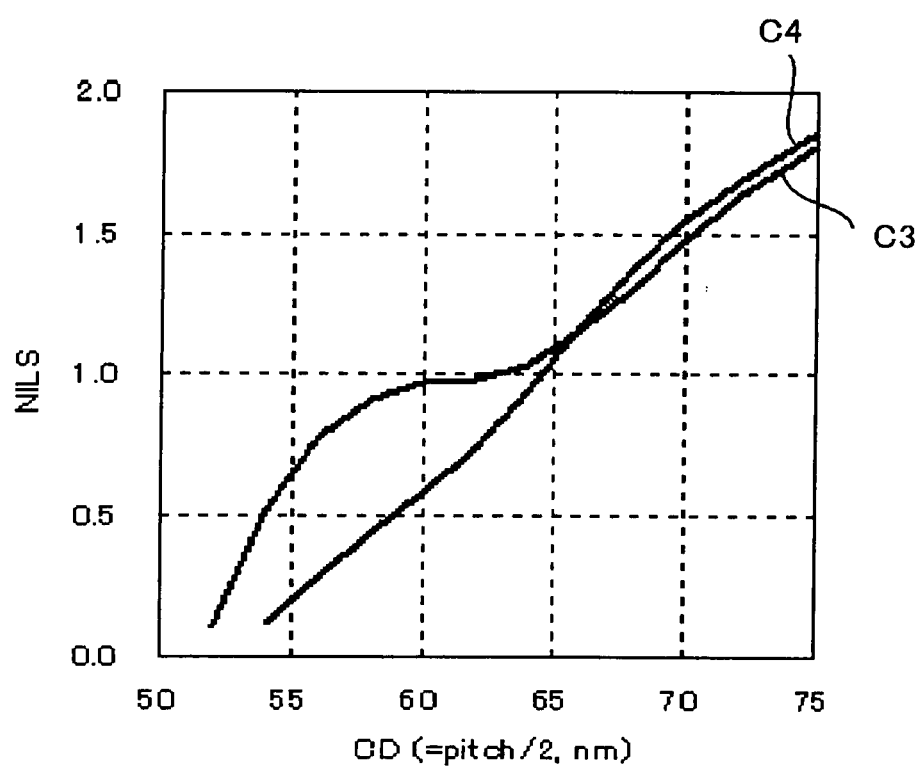
FIG. 7 is a line graph for comparison of pitch dependent NILS value calculation results between the working example and the comparative example.
Figure 8A:
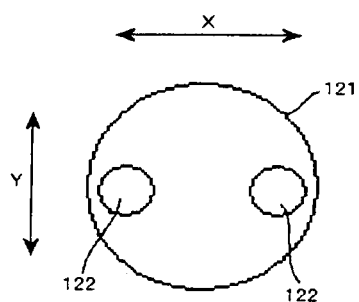
FIGS. 8A to 8D are diagrams for explaining a drawback in a conventional technique.
Figure 8B:
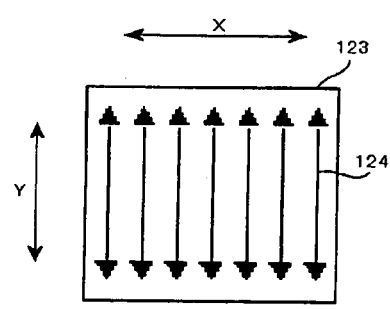
Figure 8C:
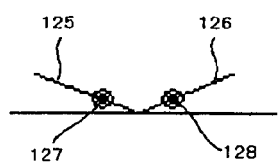
Figure 8D:
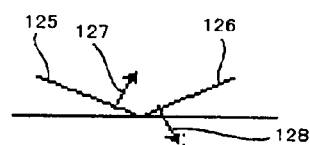
Figure 9A:
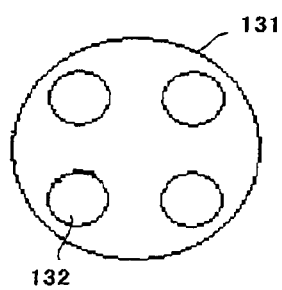
FIGS. 9A to 9D are diagrams for explaining a drawback in a conventional technique.
Figure 9B:
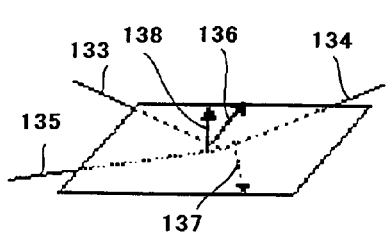
Figure 9C:
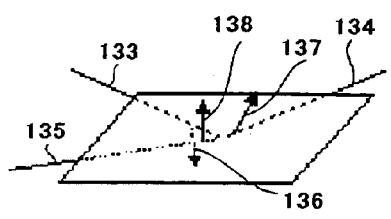
Figure 9D:
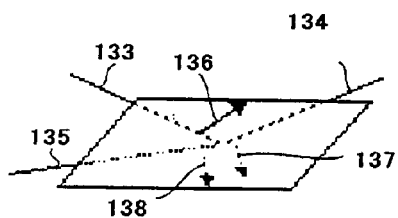
Figure 10A:
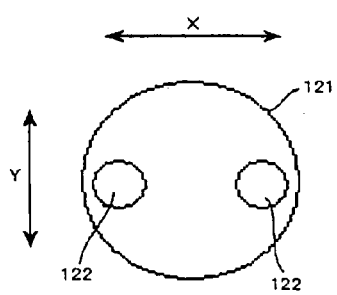
Figure 10B:
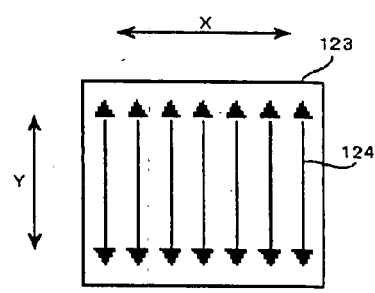
Figure 10C:
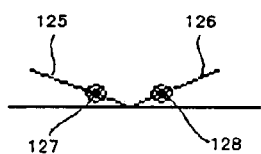
Figure 10D:
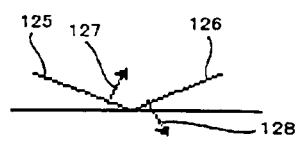

Further, FIG. 7 shows the NILS values corresponding to different pitches of the holes aligned vertically and horizontally at a ration of 1:1, under the same exposure condition. In FIG. 7, curves C3 and C4 respectively correspond to the working example and the comparative example. In the range of d/2>65 nm, no significant difference in NILS was observed between the comparative example and the working example. In contrast, in the finer size range of d/2≦65 nm, the superiority of the working example is evident. Accordingly, the foregoing embodiment is quite beneficial in improving the resolution limit of densely disposed holes. Based on a qualitative observation, as stated earlier, the superiority of the working example is secured by the conditions that satisfy the foregoing equation (2).

The exposure device and the method of exposure according to the present invention are not limited to the foregoing embodiment, but various modifications may be made. Although a dense hole pattern of the same vertical and horizontal pitch is employed as the mask pattern, the vertical and the horizontal pitch may be different from each other, and the holes may be aligned in an oblique grid pattern. Here, what is significant is not a two-dimensional arrangement of the pattern in itself, but a two-dimensional distribution of the portions in which a clear optical image can not be obtained. For instance, it is probable that the clear optical image can not be obtained in the portion where a space between mask openings is narrow even if a pitch is large. In IC patterns, for instance, a layout, in which holes having pitches or design dimensions different from one another are mixed, exists as well as the relatively regular pattern mentioned above. When such a layout exists, it is preferable that two directions, along which the above-mentioned portions in which a clear optical image can not be obtained appear the most frequently, are chosen. Also, it goes without saying that the positive and the negative image may be reversed.

Further, the location, diameter, shape and quantity of the openings in the illumination diaphragm are not limited to those described in the embodiment, but various modifications may be made. This also applies to the polarization direction, and the intersection angle, intensity and intensity ratio of polarization, ellipticity, or number of polarization directions may be modified in various manners. Such factors may be appropriately determined according to a desired wafer pattern.

It is apparent that the present invention is not limited to the above embodiment, and may be modified and changed without departing from the scope and spirit of the invention.

What is claimed is:

1. An exposure device comprising:
a polarizing unit in an optical path between a light source and a photomask, so as to polarize an illuminating light from said light source in a first and a second direction perpendicular to an optical axis of said illuminating light; and
an illumination diaphragm in an optical path between said polarizing unit and said photomask,
wherein said illumination diaphragm includes,
first and second openings located on a straight line running parallel to a third direction perpendicular to said optical axis and passing a center point of said illumination diaphragm, across said center point from each other, and
third and fourth openings located on a straight line running parallel to a fourth direction perpendicular to said optical axis and passing said center point, across said center point from each other,
wherein said illuminating light polarized in said first and said second direction by said polarizing unit passes through each of said openings, and
wherein a condition of $0<\theta_3<\theta_2<\theta_4<180°$ is satisfied, where $\theta_2$, $\theta_3$ and $\theta_4$ represent an angle at which a straight line parallel to said second, said third and said fourth direction, respectively, crosses with a straight line parallel to said first direction.

2. The exposure device according to claim 1, wherein said angles $\theta_2$, $\theta_3$ and $\theta_4$ are set substantially as 90°, 45° and 135°, respectively.

3. An exposure device comprising:

a polarizing unit in an optical path between a light source and a photomask, so as to polarize an illuminating light from said light source in a first and a second direction perpendicular to an optical axis of said illuminating light; and an illumination diaphragm in an optical path between said polarizing unit and said photomask, wherein said illumination diaphragm includes, first and second openings located on a straight line running parallel to a third direction perpendicular to said optical axis and passing a center point of said illumination diaphragm, across said center point from each other, and third and fourth openings located on a straight line running parallel to a fourth direction perpendicular to said optical axis and passing said center point, across said center point from each other, wherein said illuminating light polarized in said first and said second direction by said polarizing unit passes through each of said openings, wherein said illumination diaphragm includes a shielding portion shielding a portion of each of said openings so as to divide each of said openings into a first and a second sub-opening, and wherein said illuminating light polarized in said first and said second direction passes through said first and said second sub-opening, respectively.

4. The exposure device according to claim 3, wherein said shielding portions of said first and said second opening extend along said third direction; and said shielding portions of said third and said fourth opening extend along said forth direction.

5. The exposure device according to claim 4, wherein a width w of said shielding portion satisfies $0<w\leq 0.2$, when a distance from said center point to each of said openings is regarded as 1.

6. An exposure device comprising:

a polarizing unit in an optical path between a light source and a photomask, so as to polarize an illuminating light from said light source in a first and a second direction perpendicular to an optical axis of said illuminating light;

an illumination diaphragm in an optical path between said polarizing unit and said photomask, and a projection optical system provided in an optical path between said photomask and an object of exposure, wherein said illumination diaphragm includes, first and second openings located on a straight line running parallel to a third direction perpendicular to said optical axis and passing a centerpoint of said illumination diaphragm, across said center point from each other, and third and fourth openings located on a straight line running parallel to a fourth direction perpendicular to said optical axis and passing said center point, across said center point from each other, wherein said illuminating light polarized in said first and said second direction by said polarizing unit passes through each of said openings, and wherein an equation of $d/2 \leq \lambda/\{2^{1/2} \times NA \times (1+\sigma)\}$ is satisfied, where d represents an alignment pitch of a pattern on said photomask, $\lambda$ a wavelength of said illuminating light, NA a numerical aperture of said projection optical system, and $\sigma$ a ratio of a distance from said center point to each of said openings to said numerical aperture.

* * * * *